United States Patent [19]

Davis

[11] 4,065,158
[45] Dec. 27, 1977

[54] RECORDING SHEET FOR FORMING INTENSELY COLORED IRIDESCENT INDICIA

[76] Inventor: Chester Davis, 415 E. Fifth St., Newport, Ky. 41071

[21] Appl. No.: 549,706

[22] Filed: Feb. 13, 1975

[51] Int. Cl.$^2$ .................. B41L 1/36; B41M 5/12; B41M 5/16
[52] U.S. Cl. .................. 282/27.5; 106/137; 106/148; 106/217; 106/291; 427/146; 427/153; 428/324; 428/454; 428/413; 428/914
[58] Field of Search .............. 106/137, 148, 217, 291; 428/454, 324, 913, 914; 282/27.5, 27

[56] References Cited

U.S. PATENT DOCUMENTS

| | | | |
|---|---|---|---|
| 3,087,828 | 4/1963 | Linton | 106/291 |
| 3,235,399 | 2/1966 | Martin | 428/454 |
| 3,481,663 | 12/1969 | Grenstein | 428/324 |
| 3,766,105 | 10/1973 | Chan | 106/291 |
| 3,790,435 | 2/1974 | Tanba et al. | 428/324 |

*Primary Examiner*—J.C. Cannon
*Attorney, Agent, or Firm*—Wood, Herron & Evans

[57] ABSTRACT

A novel printing surface for recording indicia by an intensely colored iridescent interference color is provided by a white thin film of an iridescent pigment on a base web. The vivid color is developed by a dye which may be contained in the pigment coating itself, as finely divided particles not apparent to the eye, or the dye may be applied from an external source, as in a manifolding system. The pigment comprises an essentially transparent micaceous substrate having thereon at least one overcoating of an essentially transparent material having a refractive index which is greater than about 2.0, and may be mixed with up to 75% by weight of diluent material to form a low-cost recording composition.

18 Claims, No Drawings

RECORDING SHEET FOR FORMING INTENSELY COLORED IRIDESCENT INDICIA

This application is related to my copending application Ser. No. 549,797, filed Feb. 13, 1975, titled "The Enhancement of Iridescent Colors to Provide Vivid Recording Colors."

This invention relates to a novel recording sheet for recording indicia in vivid iridescent color. The invention further relates to a novel surface coating which yields intensely colored indicia from weakly colored recording compositions. This invention still further relates to an apparently colorless recording sheet which yields intensely colored indicia upon contact with chemically inert colorless fluids.

In recent years, considerable interest has been displayed in the development of non-smudging and non-staining copy papers as an improvement over "carbon paper", which uses hot-melt wax-carbon black compositions. In more expensive copy forms, such as one-time copy forms, increasing emphasis has been placed on the development of colorless systems which yield an aesthetically attractive business form having no colored coating on its reverse side. The literature is now replete with many proposed colorless copying systems and colorless or so-called colorless copy papers using such systems.

The great majority of such systems have never seen commercial usage. In the case of "chemical" systems which require a special colorless dye-former, the materials proposed have either been too reactive (i.e., they tend to color prematurely or decompose prematurely) or they yield colors which lack the desired color shade, intensity, or light stability. As it is, of those recording papers now on the market which use a special colorless chemical, only one yields an intense, reasonably light-stable print, but even that paper requires a somewhat expensive colorless dye salt as a recording substance and a special recording sheet for its color development.

A number of "physical" copying systems have been proposed for use in recording papers for over forty years, especially within the past ten years. None of them have seen commercial use, outside of a very limited application as frictional stylus papers and "magic slate" systems. The major drawback to such physical systems is that they use a colored coating beneath an obscuring (opaque white or translucent white) top coating; the obscuring top coating is not easily removed or destroyed in a commercially feasible manner. Again, the top coatings usually have very poor hiding power in the very thin films now required for multiple copy forms.

For example, systems having a white coating on top of a black coating on the reverse side of a top sheet have had both coatings "picked off" by an adhesive coating on the receiving sheet. This requires three separate coating operations and a rather opaque top sheet to prevent the black coating from being visible through the top sheet. Systems wherein a white coating is placed over a black coating and then subjected to a very strong, very volatile solvent (trichlorethylene, chloroform, etc.) which causes the black coating to migrate through the white coating to the surface to form a print give neither an intense print nor a sharp print, and the strong solvents required for such leaching action are too hazardous for use in commercial coatings. Again, in multiple copy forms which use thin base papers, the black coatings are visible through the base web and are not aesthetically attractive.

Although no true "physical" system for use in colorless copy papers has yet been commercially achieved, it has always been assumed in the recording industry that the real attraction of such a system is that it would theoretically be cheaper than one which uses a special organic color-forming material, and would avoid many of the color problems (stability, intensity, shade, solubility, etc.) associated with the development, manufacture and use of special colorless dye-formers.

It is the purpose of the present invention to provide a simple recording sheet and manifolding system which operates on a physical principle, using low-cost materials in a commercially attractive manner.

Applicant recently discovered a novel method, disclosed in my previously identified co-pending application, "The Enhancement of Iridescent Colors to Provide Vivid Recording Colors". That method enables intensely colored indicia to be obtained from weakly iridescent materials which are known as "iridescent pigments". These pigments comprise essentially transparent micaceous substrates having thereon at least one optical interference overcoating of an essentially transparent material having a refractive index which is greater than about 2.0 and characterized by an interference reinforced wave band reflected back from the optical interference overcoating. When dry, they are white, free-flowing powders with a weak nacreous lustre. When wet with liquid, especially with oily liquid, these pigments exhibit a weak, iridescent coloration and a strong nacreous lustre. These pigments have been used to form pearl essences and pearl-like fingernail polishes.

A chance observation by applicant led to the discovery that the iridescent interference reinforced colors displayed by this type of iridescent pigment could be markedly enhanced to a practical level for use as vivid recording colors by the application to the pigment's surface of a small amount of a solvent-soluble dye which absorbed wavelengths complementary to the iridescent interference reinforced reflection color of the particular iridescent pigment used.

An attempt was then made to utilize these iridescent pigments as essentially colorless (white) coatings which would record indicia as intensely colored iridescent colors for use in business recording systems. Considerable experimentation revealed, among other things, that the mechanism of color enhancement was the removal of those wavelengths of light which are transmitted through the overcoating layer (the optical interference coating, from which is reflected the strengthened interference reflection color wavelengths), then through the essentially transparent iridescent pigment to its opposite surface, where they are normally refracted and reflected back to the observer's eye.

For example, a blue interference reflection color is enhanced when red wavelengths, which are complementary to blue, are absorbed by a red-absorptive film (such as Nigrosine Black solution of Sudan Blue solution) on the iridescent pigment's outer surface. The film does not appreciably absorb the interference reinforced wave band which is reflected back from the optical interference coating. (For a discussion of the phenomenon of interference reflection, see P. Baumeister and G. Pincus, "Optical Interference Coatings", pages 58–75, *Scientific American* for December, 1970.) Those dyes which absorb wavelengths complementary to the interference reinforced reflection color of an iridescent pigment function, therefore, by removing competing wavelengths which are refracted through the pigment surface and thereby reveal (uncover) the actually intense but normally obscured interference reinforced reflection color of the iridescent pigment.

It was further found that those binders which are transparentized by commercial printing fluids could be used to bind the iridescent pigment to any suitable support, without diminishing the enhancement of iridescent reflection color by a colored solution possessing an absorption band complementary to the interference reinforced reflection color of the particular iridescent pigment used.

The binders used in the present invention are solid binders having a refractive index less than 1.8. Such binders appear white in air, but when they are contacted by liquids having a refractive index less than 1.8, they are essentially transparentized to visible light and do not prevent enhancement of the iridescent pigment's interference reflection color.

The most suitable binders are the starch binders (corn starch, tapioca starch, etc.), modified starch binders, and the organic solvent free latex binders (polyvinyl acetate emulsions, polyacrylic emulsions, etc.). These give low-cost coating compositions with good pigment adhesion, good leveling (i.e., the resultant coatings are uniform in thickness and are flat), and good printing performance. The latex binders give less curl than do other types. Other binders, such as casein, gelatin, polyvinyl alcohol, natural and synthetic hydrocolloids, can be used, for some applications.

The iridescent pigments used in the present invention are commercially available. From an optics viewpoint, they comprise a base substrate of essentially transparent (colorless) plate-like structure, with at least one optical interference overcoating of an essentially transparent material having a refractive index greater than that of the base substrate and are characterized by an interference reinforced wave band reflected back from the optical intereference overcoating. They are made commercially by overcoating a micaceous substrate with an extremely thin film of a material such as titanium dioxide or zirconium dioxide, having a refractive index which is substantially higher than that of the base substrate and which usually is greater than about 2.0. Such pigments are disclosed in U.S. Pat. Nos. 3,071,482 and 3,087,828 and are available from the Mearl Corp., 41 East 42nd St., New York, N.Y. 10017, under the name "Flamenco Nacreous Pigments." It is preferred in this invention to use those pigments wherein the micaceous substrate is overcoated with titanium dioxide. Such pigments, while intrinsically cheap (mica costs about five cents per pound) are now available as "specialty products" at $8.50 or more per pound.

Although the pigment itself is thus rather expensive, the applicant discovered a simple, practical method for markedly lowering the effective composition costs of the coatings used in the practice of the present invention while still retaining excellent recording characteristics. It was discovered by experimentation that, with little if any loss of effectiveness, the iridescent pigment could be mixed with up to 75% by weight of water-soluble, essentially transparent materials having a refractive index less than about 1.8. Such materials are "white" or "cream colored" in air but are transparentized by immersion in a liquid having a refractive index under 1.8. Suitable diluents for this purpose include mica, talc, pumice, kaolin clay, attapulgus clay and other coating clays, mineral silicates, silica, cellulose fibers, calcium carbonate, magnesium carbonate, and the like.

As set forth in my co-pending application, to which reference is made, vivid colors are developed from such weakly iridescent pigments by treating them with a solvent-soluble dye which has an absorption band complementary to the interference reinforced reflection color of the pigment. The iridescent pigments used in the present invention are white powders in the dry state. They therefore can be used to obscure the colors of finely divided dye particles when up to approximately 5% by weight of dye particles are present. For example, if a mixture is formed of 99% by weight of Iridescent Blue Pigment (i.e., a titanium dioxide coated mica which displays a blue interference reflection color) and 1% by weight of particles of a solid, finely divided oil-soluble dye such as Sudan Blue CSP (GAF Corp.), the mixture will appear white or cream colored. This is because the eye detects only the "mass color" of the mixture, which is white. However, when the mixture is treated with a solvent for the dye (diisooctyl phthalate, tricresyl phosphate, etc.), the dye spreads over the pigment surface as a very thin film of a colored solution, and yields an intensely colored pigment-dye system with good "covering power". By this novel method, colored indicia can be obtained on an apparently colorless recording sheet.

In a similar manner, a manifolding system can be provided which uses an iridescent pigment-coated receiving sheet in conjunction with a top sheet whose reverse is coated with a mixture of encapsulated droplets, of which 1–5% contain a concentrated color solution possessing an absorption band complementary to the reflection color of the particular pigment used and 95–99% contain a colorless fluid which is miscible with the dye solution. (Such droplets can be made with present technology.) Pressure on the top sheet transfers a mixed solution which yields a weak print on ordinary paper but an intensely colored iridescent print on the receiving sheet containing the present iridescent pigment coating.

As pointed out in my co-pending application, one dye may give enhancement of two different colored iridescent pigments. For example, a black dye gives an intense blue iridescent color if used with Iridescent Blue Pigment and an intense red iridescent color if used with Iridescent Red Pigment (i.e., a titanium dioxide coated mica which displays a red interference reflection color); a red-violet dye gives an intense blue iridescent color with Iridescent Blue Pigment and an intense red iridescent color with the Iridescent Red Pigment. Likewise, a blue-green dye gives an intense blue color with the Iridescent Blue Pigment and an intense green iridescent color with the Iridescent Green Pigment (i.e., a titanium dioxide coated mica which displays a green interference reflection color). By this means, it is possible to obtain two (or three) colors on a receiving sheet from one top sheet by using as a receiving sheet one which has been coated with strips of different iridescent pigments (as in double entry bookkeeping which uses blue and red inks, etc.). This has previously been attainable only by the use of different color-formers in conjunction with different strips on a receiving sheet. By means of the present invention, only one simple, inexpensive dye can be used to yield copies in two or three colors.

Other applications of the present invention will become apparent to those skilled in the art. The following examples illustrate but do not limit the application of the principles of this invention.

EXAMPLE 1

A coating composition comprising 10 grams of Iridescent Blue Pigment in 100 grams of water containing 2 grams of gelled and dispersed cornstarch was coated onto a standard base paper (13 pounds per ream) with a coating rod, and the coating was air-dried. The resultant thin film was white and had good adhesion to the base web. Treatments with a dilute solution of Nigrosine Black Oleate in oleic acid-mineral oil by contacting the film surface with sufficient liquid to wet the pigment-binder particles and coat them with an extremely thin colored film gave an intense blue iridescent print. Treatment with Amasolve Blue SF in diisooctyl phthalate gave an intense blue iridescent print. Treatment with Amasolve Black FPE in diisooctyl phthalate gave an intense iridescent blue print.

EXAMPLE 2

A coating composition comprising 1 gram Iridescent Red Pigment in 10 grams of water containing 1 gram of polyvinyl acetate emulsion latex binder was coated onto a standard base web with a coating rod. The resultant white coating was air-dried and gave a uniformly flat coating with no tendency to curl. Treatment with Amasolve Violet R in acetone-DIOP gave an intense iridescent red print. Treatment with Nigrosine Black Oleate in oleic acid-mineral oil gave an intense red iridescent print.

EXAMPLE 3

A coating composition comprising 1 gram of Iridescent Green Pigment in 10 grams of water containing 0.4 grams of gelled and dispersed tapioca starch was coated onto a standard base web with a coating rod, and the coating was air-dried. The resultant white coating had a very faint green iridescence. Treatment with Amasolve Blue SF in acetone gave an intense green iridescent print. Treatment with Amasolve Black FPE in DIOP gave an intense iridescent green print. Treatment with Amasolve Blue OR in tricresyl phosphate gave an intense iridescent green print.

EXAMPLE 4

A coating composition comprising 1 gram Iridescent Yellow Pigment (i.e., a titanium dioxide coated mica displaying a golden yellow interference reflection color) in 10 grams of water containing 0.4 grams of gelled and dispersed tapioca starch was coated onto a standard base web with a coating rod, and the coating was air-dried. The resultant white coating had a very faint yellow sheen. Treatment with Amasolve Black FPE in DIOP gave an intense iridescent yellow print. Treatment with Nigrosine Black Oleate in oleic acid-mineral oil gave an intense yellow iridescent print.

EXAMPLE 5

A coating composition comprising 10 grams of Iridescent Blue Pigment in 50 ml. of warm water containing three grams of gelatin dissolved therein was coated onto a plastic film base (cellulose acetate film) and air-dried to give a thin white film on a plastic base. Treatment with Amasolve Black in DIOP gave an intense iridescent blue print. The same coating composition was coated onto aluminum film and air-dried to give a thin white film. Treatment with Nigrosine Black Oleate in oleic acid-mineral oil gave an intense iridescent blue print.

EXAMPLE 6

Photoreactive Printing System

A recording sheet was prepared by coating, onto a standard paper base web, a composition comprising 10 grams of Iridescent Blue Pigment in 100 ml. of water containing 4 grams of gelled and dispersed cornstarch. This coating was air-dried to give a white sheet. A photosensitive coating was then prepared by emulsifying 15 grams of 5% Nigrosine Black Oleate solution in oleic acid in 100 ml. of warm water containing 5 grams of gelatin dissolved therein. To this emulsion was added in dim light a solution of 1.5 grams of sodium dichromate in 20 ml. of warm water. The resultant emulsion was coated onto a standard paper base web and air-dried in a dark room, giving a light-sensitive printing sheet. This was exposed under a photographic negative to an intense light source. The light-exposed areas are hardened and insolubilized; the areas protected from light remain water-soluble. The light-exposed master was soaked in water to remove the light-protected (unexposed) areas from the coating and air-dried. The dried master sheet was then placed in contact with the iridescent pigment-coated receiving sheet and subjected to heavy pressure, whereupon an iridescent blue positive copy from the negative appeared on the recording sheet. The same photographic master gave with an Iridescent Red Pigment coated receiving sheet an intense iridescent red copy right. With an Iridescent Green Pigment coated recording sheet, the same master gave an intense green iridescent copy print.

EXAMPLE 7

Self-Contained Recording Sheets

The above examples are recording papers which require color development from an external source. It has been found that a self-contained recording paper may be prepared by incorporating with the iridescent pigment a small amount of a water-soluble coloring matter in a finely divided form, either as solid dye particles or as encapsulated solution. The coloring matter (dye) is less than about 5% by weight of the pigment in the coating, and usually 1% to 3% is used. The water-soluble dye may be either spirit-soluble or oil-soluble; for commercial purposes, oil-soluble dyes are preferred. As the base color of the coating is "white", the addition of small amounts of water-insoluble colored particles does not dominate the background color but yields a cream to light gray color depending on concentrations used. The resultant coating compositions when coated onto a base web and air-dried give a creamy to gray coating of pleasing appearance.

When the solvent-soluble dye is present in finely divided form, treatment with the solvent in which the dye is soluble (e.g., an organic liquid such as diisooctyl phthalate, tricresyl phosphate, mineral oil, oleic acid, etc.) causes the dye to dissolve in the solvent and spreads the dye over the iridescent pigment surfaces as a very thin colored film. This develops an intense iridescent interference reinforced reflection color. The solvent used can be present in the pigment coating as an encapsulated liquid to give a true self-contained recording sheet, or the solvent can be transferred from the reverse of a top sheet, as in a manifolding system, under pressure. In either case, pressure of writing ruptures the capsules containing colorless liquid to dissolve the finely divided dye and spread the colored liquid over the pigment surface to produce an intensely colored iridescent indicia. Where the solvent-soluble dye is present as an encapsulated solution, writing pressure instantly ruptures the capsules and spreads the colored solution over the pigment surface to provide an intensely colored indicia.

One such self-contained recording paper is prepared by coating a composition comprising 50 parts of Iridescent Blue Pigment, 20 parts of silica, 1 part of Sudan Blue dye powder, and 25 parts of encapsulated diisooctyl phthalate in 250 parts of water containing a small amount of ammoniated casein as binder onto a standard paper base web. The coating was air-dried to give a creamy white coating. Pressure with a stylus gave an iridescent blue print which steadily became more intense.

In place of finely divided Sudan Blue in the above formulation, one can use an encapsulated solution of 5% Nigrosine Black Oleate in oleic acid to the extent of 5 parts of encapsulated black solution, 50 parts of Iridescent Blue Pigment, etc. In this case, the initial blue print reaches full intensity in less than 30 seconds.

EXAMPLE 8

The coating compositions of the present invention can be made more commercially effective by the use of a suitable diluent material for the iridescent pigment which will not obscure the iridescent interference reinforced reflection color of the interference pigment nor interfere with the enhancement of the iridescent color during the recording operation. The most suitable diluent materials are essentially transparent water-insoluble solids with a refractive index below 1.8. Usually, materials with the indices of 1.5 to 1.7 work best. Such solids appear opaque ("white") in air but become transparent or translucent when immersed in a liquid whose refractive index is close to that of the solid.

The most desirable diluent materials are the inexpensive finely divided clays, finely divided silicas (silica, diatomaceous earth, etc.), mineral silicates and aluminosilicates, magnesium carbonate and calcium carbonate, cellulose fibers, and the like. Careful experimentation revealed that up to 75% of diluent to 25% iridescent pigment can be incorporated into coatings without destroying the iridescent recording characteristics of these coatings. An approximate 50—50 mixture by weight of diluent to iridescent pigment is preferred. This permits the attainment of a commercial coating composition with good iridescent color recording characteristics, attractive appearance, and good handling properties at a reasonable cost.

A mixture of 5 grams of Iridescent Blue Pigment and 5 grams of finely divided silica were thoroughly dispersed in 50 grams of water containing 4 grams of gelled and dispersed cornstarch. The coating composition was coated onto a standard paper base web and air-dried to give an attractive creamy white coating. Treatment with a dilute solution of Nigrosine Black Oleate in oleic acid-mineral oil gave an intense iridescent blue print which was essentially identical with the print made on a similar receiving sheet containing 100% Iridescent Blue Pigment. Similar coatings were made using a 50—50 mixture of extra fine white pumice with Iridescent Green Pigment. In each case, the intensity of the iridescent indicia from the 50% mixture was essentially as intense as that obtained from the 100% pigment composition.

EXAMPLE 10

A mixture of 10 grams of Iridescent Blue Pigment and 10 grams of extra fine white pumice was thoroughly dispersed in 100 grams of warm water containing 7 grams of gelatin dissolved therein. The resultant coating composition was coated onto a standard paper base web and air-dried to give a smooth white coating. Treatment with a solution of Nigrosine Black Oleate in oleic acid gave an intense iridescent blue print which was essentially as intense as that obtained from a coating containing 100% Iridescent Blue Pigment.

EXAMPLE 11

Multiple Color Recording Sheets

Three separate coating compositions were made using Iridescent Blue Pigment in one, Iridescent Red Pigment in another, and Iridescent Green Pigment in the third. For example, 1 gram of Iridescent Green Pigment and 1 gram of water ground mica were thoroughly dispersed in 10 grams of water containing 0.5 grams of gelled and dispersed tapioca starch. The resultant coating composition was coated in a two-inch strip on a standard paper base web. A similar coating using Iridescent Blue Pigment and mica was coated in a two-inch strip next to the Iridescent Green Pigment-mica strip. A similar coating using Iridescent Red Pigment and mica was coated in a two-inch strip next to the Iridescent Blue Pigment-mica strip. The final air-dried coating was uniformly white. When this recording sheet was used in conjunction with a top sheet containing encapsulated Nigrosine Black Oleate in oleic acid to form a manifolding system, writing pressure on the top sheet gave impressions in three different colors on the receiving sheet: iridescent green, iridescent blue, and iridescent red.

EXAMPLE 12

Another multiple color recording sheet was prepared from a coating composition comprising 100% Iridescent Blue Pigment in water containing a polyvinyl acetate latex emulsion binder and a coating composition comprising 100% Iridescent Red Pigment in water containing a polyvinyl acetate latex emulsion binder. These coating compositions were separately coated in four inch strips on paper, one alongside the other, and air-dried. The resultant white recording sheet when used in conjunction with a top sheet containing Amasolve Violet R in DIOP gave iridescent blue writing on one half and iridescent red writing on the other half, from the same top sheet.

It should be clearly understood that the invention is not limited to the examples set forth and that a wide variety of coloring materials, binders, diluents, and additives can be used in conjunction with iridescent pigments to form the recording sheets of the present invention, in accordance with the following claims.

Having described my invention, I claim:

1. A recording sheet comprising, a colorless base web having a substantially white surface coating comprising,
    an iridescent pigment of the type comprising an essentially transparent micaceous substrate having thereon at least one optical interference overcoating of an essentially transparent material having a refractive index over about 2.0 and characterized by an interference reinforced wave band reflected back from the optical interference overcoating,
and an organic solvent-free binder for said iridescent pigment.

2. A substantially white printing surface comprising, a thin film of an iridescent pigment of the type comprising an essentially transparent micaceous substrate having thereon at least one optical interference overcoating of an essentially transparent material having a refractive index over about 2.0 and characterized by an interference reinforced wave band reflected back from the optical interference overcoating,
and an organic solvent-free binder for said pigment.

3. The surface of claim 2 wherein the iridescent pigment used is one which exhibits a blue to violet interference reinforced reflection color.

4. A substantially white recording sheet comprising a colorless base web having thereon a white surface coating comprising,
a mixture of
at least 25% of an iridescent pigment of the type comprising an essentially transparent micaceous substrate having thereon at least one optical interference overcoating of an essentially transparent material having a refractive index over about 2.0 and characterized by an interference reinforced wave band reflected back from the optical interference overcoating,
and up to 75% of a water-insoluble diluent, said diluent comprisisng an essentially transparent material having a refractive index less than 1.8,
and an organic solvent-free binder for said mixture.

5. A substantially white printing surface comprising a thin film of
a mixture of
at least 25% of an iridescent pigment of the type comprising an essentially transparent micaceous substrate having thereon at least one optical interference overcoating of an essentially transparent material having a refractive index over about 2.0 and characterized by an interference reinforced wave band reflected back from the optical interference overcoating,
and up to 75% of a water-insoluble diluent material, said diluent material being transparent and having a refractive index less than 1.8,
and an organic solvent-free binder for said mixture.

6. The printing surface of claim 5 wherein the iridescent pigment is an essentially transparent micaceous substrate having thereon at least one overcoating of titanium dioxide.

7. The printing surface of claim 5 wherein the diluent material is a member of the class consisting of silica and the inorganic silicates.

8. The printing surface of claim 5 wherein the diluent material is a finely divided clay material.

9. The printing surface of claim 5 wherein the diluent material is a member of the class consisting of calcium carbonate and magnesium carbonate.

10. The printing surface of claim 5 wherein the diluent material is a micaceous substance.

11. A self-contained substantially white recording sheet comprising a colorless base web having thereon a coating comprising
a mixture of
an iridescent pigment comprising an essentially transparent micaceous substrate having thereon at least one optical interference overcoating of an essentially transparent material having a refractive index over about 2.0 and characterized by an interference reinforced wave band reflected back from an optical interference overcoating,
and up to about 5% by weight of a solvent soluble organic coloring matter present in the form of finely divided particles,
and an organic solvent-free binder for said mixture.

12. A self-contained substantially white printing surface comprising a thin film of
a mixture of (1) an iridescent pigment comprising an essentially transparent micaceous substrate having thereon at least one optical interference overcoating of an essentially transparent material having a refractive index over about 2.0 and characterized by an interference reinforced wave band reflected back from an optical interference overcoating and (2) up to about 5% by weight of a solvent soluble organic coloring matter present in the form of finely divided particles,
and an organic solvent-free binder for said mixture 13. A manifolding system comprising
a receiving sheet having an upper surface with a coating thereon comprising
an iridescent pigment of the type comprising an essentially transparent micaceous substrate having thereon at least one optical interference overcoating of an essentially transparent material having a refractive index over about 2.0 and characterized by an interference reinforced wave band reflected back through the optical interference overcoating,
and a binder for said pigment,
and a transfer sheet having a reverse surface with a coating thereon comprising an encapsulated dye solution, said solution having an absorption band complementary to the interference reflection color of the iridescent pigment,
said transfer sheet being arranged so that pressure on the top surface transfers the dye solution to the receiving sheet surface, thereby forming an intensely colored iridescent indicia.

14. A manifolding system comprising
a receiving sheet having an upper surface with a coating thereon comprising
a mixture of
at least 25% of an iridescent pigment of the type comprising an essentially transparent micaceous substrate having thereon at least one optical interference overcoating of an essentially transparent material having a refractive index over about 2.0 and characterized by an interference reinforced wave band reflected back through the optical interference overcoating,
and up to 75% of a water-insoluble diluent material, said diluent material being transparent and having a refractive index less than 1.8,
and a binder for said mixture,
and a transfer sheet having a reverse surface with a coating thereon comprising an encapsulated dye solution, said solution having an absorption band complementary to the interference reflection color of the iridescent pigment,
said transfer sheet being arranged so that pressure on the top surface transfers the dye solution to the receiving sheet surface, thereby forming an intensely colored iridescent indicia.

15. A substantially white recording sheet comprising, a colorless base web having a surface coating comprising an iridescent pigment of the type comprising an essentially transparent plate-like base substrate having thereon at least one optical interference overcoating of an essentially transparent material having a refractive index greater than that of the base substrate and characterized by an interference reinforced wave band reflected back from the optical interference overcoating, and an organic solvent-free binder for said iridescent pigment.

16. A substantially white printing surface comprising, a colorless base web having a white surface coatiang comprising, a thin film of an iridescent pigment of the type comprising an essentially transparent plate-like base substrate having thereon at least one optical interference overcoating of an essentially transparent material having a refractive index greater than that of the base substrate and characterized by an interference reinforced wave band reflected back from the optical interference overcoating, and an organic solvent-free binder for said iridescent pigment.

17. A manifolding system comprising a receiving sheet having an upper surface with a coating thereon comprising a mixture of an iridescent pigment of the type comprising an essentially transparent micaceous substrate having thereon at least one optical interference overcoating of an essentially transparent material having a refractive index over about 2.0 and characterized by an interference reinforced wave band reflected back from the optical interference overcoating, and up to about 5% by weight of a solvent soluble organic coloring matter present in the form of finely divided particles, said organic coloring matter having an absorption band complementary to the interference reflection color of the iridescent pigment, and an organic solvent free binder for said mixture, and a transfer sheet having a reverse surface with a coating thereon comprising an encapsulated solvent for the finely divided particles, said transfer sheet being arranged so that pressure on the top surface thereof transfers the solvent for the particles to the receiving sheet where it dissolves the particles and spreads the said coloring matter over the iridescent pigment thereby forming an intensely colored indicia.

18. A self-contained substantially colorless recording sheet comprising a colorless base web having thereon a coating comprising a mixture of an iridescent pigment of the type comprising an essentially transparent micaceous substrate having thereon at least one optical interference overcoating of an essentially transparent material having a refractive index over about 2.0 and characterized by an interference reinforced wave band reflected back from the optical interference overcoating, and up to about 5% by weight of an encapsulated dye solution of an organic coloring matter, said solution having an absorption band complementary to the interference reinforced reflection wave band of the iridescent pigment, and an organic solvent-free binder for said mixture.

* * * * *